(12) United States Patent
Bolotin et al.

(10) Patent No.: US 8,028,100 B2
(45) Date of Patent: Sep. 27, 2011

(54) AUTOMATED PROCESSING SYSTEM EMPLOYING INTELLIGENT MODULE AUTOMATIC RECOGNITION

(75) Inventors: Lev M. Bolotin, Kirkland, WA (US); Bradley Morris Johnson, Edmonds, WA (US); Carl W. Olson, Renton, WA (US)

(73) Assignee: Data I/O Corporation, Redmond, WA (US)

( * ) Notice: Subject to any disclaimer, the term of this patent is extended or adjusted under 35 U.S.C. 154(b) by 1255 days.

(21) Appl. No.: 11/676,733

(22) Filed: Feb. 20, 2007

(65) Prior Publication Data

US 2007/0276682 A1 Nov. 29, 2007

Related U.S. Application Data

(60) Provisional application No. 60/746,595, filed on May 5, 2006.

(51) Int. Cl.
*G06F 19/00* (2011.01)
*G06F 3/00* (2006.01)
*G01R 31/00* (2006.01)
*G01D 3/00* (2006.01)

(52) U.S. Cl. ....... 710/8; 324/750.16; 700/121; 702/108; 702/117; 702/118; 710/15; 710/16

(58) Field of Classification Search ............ 324/750.16, 324/750.19, 756.01, 756.02, 537; 700/90, 700/95, 117, 121; 702/108, 117, 118; 710/1, 710/8–16
See application file for complete search history.

(56) References Cited

U.S. PATENT DOCUMENTS

| 5,592,373 | A | 1/1997 | Barthel et al. |
| 5,828,223 | A * | 10/1998 | Rabkin et al. ............ 324/750.19 |
| 6,195,165 | B1 | 2/2001 | Sayegh |
| 6,487,623 | B1 | 11/2002 | Emerson et al. |
| 6,538,244 | B1 | 3/2003 | Skunes |
| 6,657,426 | B1 * | 12/2003 | Powell et al. ............ 365/185.18 |
| 6,895,661 | B1 | 5/2005 | Gamel et al. |
| 2003/0065752 | A1 | 4/2003 | Kaushik et al. |
| 2003/0084277 | A1 * | 5/2003 | Przywara et al. ................. 713/1 |
| 2005/0270062 | A1 | 12/2005 | Cornett |

FOREIGN PATENT DOCUMENTS

JP 2003022139 1/2003

* cited by examiner

*Primary Examiner* — Alford Kindred
*Assistant Examiner* — Richard B Franklin
(74) *Attorney, Agent, or Firm* — Mikio Ishimaru

(57) ABSTRACT

An automated processing system that includes providing an intelligent module with a composite connection for transmitting information and configuring the intelligent module within the automated processing system for automatic recognition.

20 Claims, 4 Drawing Sheets

AUTOMATED PROCESSING SYSTEM EMPLOYING INTELLIGENT MODULE AUTOMATIC RECOGNITION

CROSS-REFERENCE TO RELATED APPLICATION(S)

This application claims the benefit of U.S. Provisional Patent Application Ser. No. 60/746,595 filed May 5, 2006.

The present application contains subject matter related to a co-pending U.S. patent application Ser. No. 11/467,087. The related application is assigned to Data I/O Corporation.

The present application contains subject matter related to a co-pending U.S. patent application Ser. No. 11/381,696. The related application is assigned to Data I/O Corporation.

The present application contains subject matter related to a co-pending U.S. patent application Ser. No. 11/381,532. The related application is assigned to Data I/O Corporation.

TECHNICAL FIELD

The present invention relates generally to automated systems, and more particularly to automated processing system s.

BACKGROUND ART

Within the automated systems industry there are two main types of automated processing system s available in the marketplace, the high efficiency (specialized) system or the quickly configurable (flexible) system. The high efficiency systems produce thousands of units with a very high throughput per unit time, unfortunately, they are extremely difficult to reconfigure for a new device or a new programming job. Consequently, the high efficiency systems require a lot of down time and special training for the operators before implementation of a new device or new programming job can be put into production.

The quickly configurable systems are not high productivity systems but they are easy to configure. They can be reconfigured for new devices, new program jobs, and new input/output media because they are designed for very specific devices, programming jobs, and input/output media.

Both of the above systems fail to fill the need of small batch device production with varied device characteristics and performance for the rapidly changing needs of on-time demand customers. Lamentably, today's technology fails to even provide intelligent design and plug-and-play capability for most modules. For instance, many conventional systems require the development of specialized processes to connect and communicate with a programming system. Specialized dialogs and/or operating systems might need to be created for each module, and more often than not, these systems are unstable and cumbersome to operate.

Today's automated processing system s market needs to produce a system that can be easily and quickly reconfigured for new devices, new programming jobs and/or new input/output media.

Thus, a need still remains for an automated processing system that can be easily and quickly reconfigured. In view of the ever-increasing need to save costs and improve efficiencies, it is more and more critical that answers be found to these problems.

Solutions to these problems have been long sought but prior developments have not taught or suggested any solutions and, thus, solutions to these problems have long eluded those skilled in the art.

DISCLOSURE OF THE INVENTION

The present invention provides an automated processing system, which includes providing an intelligent module with a composite connection for transmitting information and configuring the intelligent module within the automated processing system for automatic recognition.

Certain embodiments of the invention have other aspects in addition to or in place of those mentioned above. The aspects will become apparent to those skilled in the art from a reading of the following detailed description when taken with reference to the accompanying drawings.

BEST MODE FOR CARRYING OUT THE INVENTION

Figure 1:
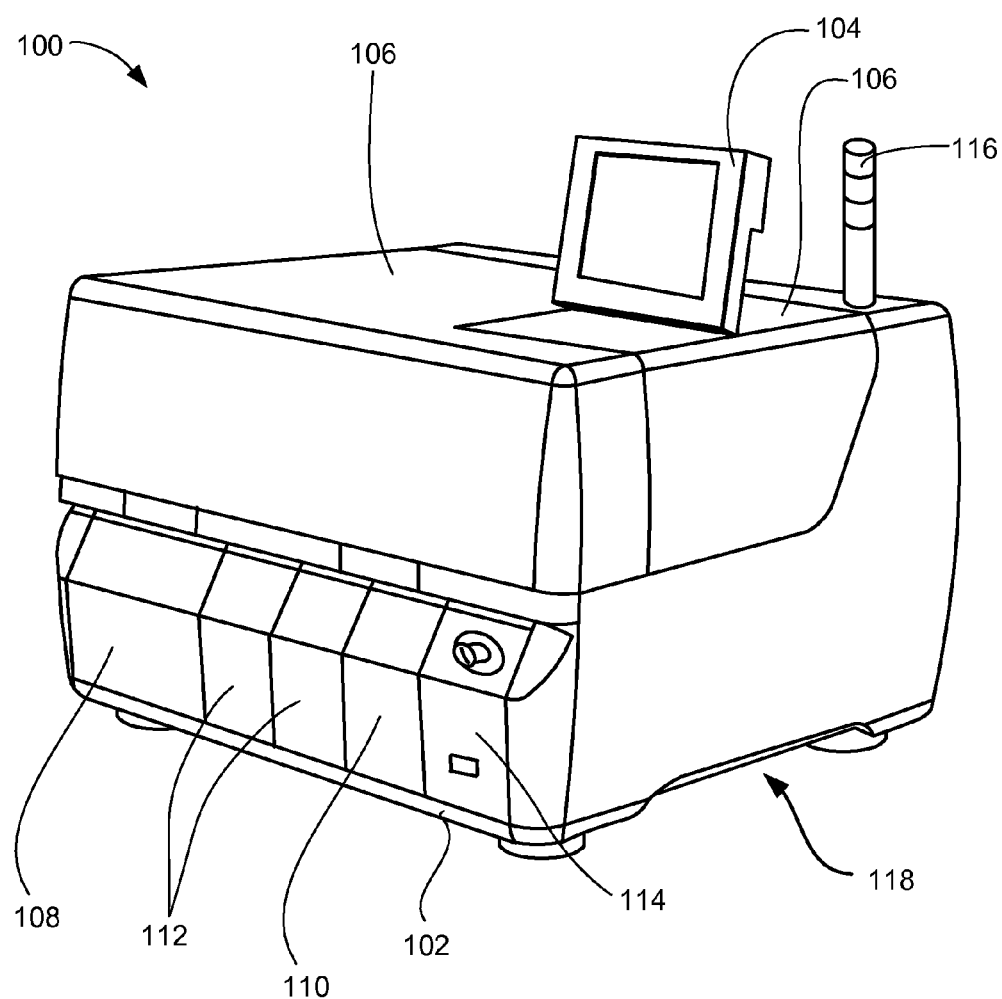
FIG. 1 is an isometric view of an automated processing system in accordance with an embodiment of the present invention.

The following embodiments are described in sufficient detail to enable those skilled in the art to make and use the invention, and it is to be understood that other embodiments would be evident based on the present disclosure and that process or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known system configurations, and process steps are not disclosed in detail. Likewise, the drawings showing embodiments of the invention are semi-diagrammatic and not to scale and, particularly, some of the dimensions are for the clarity of presentation and are shown exaggerated in the drawing FIGs. In addition, where multiple embodiments are disclosed and described having some features in common, for clarity and ease of illustration, description, and comprehension thereof, similar and like features one to another will ordinarily be described with like reference numerals.

The term "horizontal" as used herein is defined as a plane parallel to the plane or surface of the top of an automated processing system, regardless of its orientation. The term "vertical" refers to a direction perpendicular to the horizontal as just defined. Terms, such as "on", "above", "below", "bottom", "top", "side" (as in "sidewall"), "higher", "lower", "upper", "over", and "under", are defined with respect to the horizontal plane.

Referring now to FIG. 1, therein is shown an isometric view of an automated processing system 100 in accordance with an embodiment of the present invention. The automated processing system 100 includes a frame 102, a monitor 104, a cover 106, an input module 108, an output module 110, a programming module 112, control electronics 114, and a status indicator 116. General exemplary illustrations of the automated processing system 100 may include an automated programming system, an automated testing system or an automated assembly system. A more specific exemplary illustration of the automated processing system 100 may include a desktop handler system, which is a portable programming system. To enhance portability of the desktop handler system, handles 118 may be built-in.

The frame 102, such as an L-shaped base, is the main housing that holds all the elements together and provides structural support. The monitor 104 can be mounted to a fixed portion of the cover 106. By way of example and not by way of limitation, the monitor 104 may include a touch screen user interface system that provides visual feedback to the operator.

The cover 106 is also mounted to the frame 102 and covers the working envelope of the machine. The cover 106 offers protection to the input module 108, the output module 110, and the programming modules 112 from dust and debris within the working environment. Additionally, the cover 106 protects an operator from unintended operational hazards.

Devices and/or media enter and exit the automated processing system 100 via removable modules, such as the input module 108 or the output module 110. Alternatively, the devices and/or media can be placed within or removed from the automated processing system 100 without removing the input module 108 and the output module 110 from the automated processing system 100. By way of example, the input module 108 and the output module 110 may be configured to accommodate trays or other receptacles, which conform to Joint Electron Device Engineering Council (JEDEC) standards. However, it is to be understood that the present invention is not to be limited to such configurations. In accordance with the present invention the input module 108 and the output module 110 may accommodate any device receptacle.

The programming modules 112 provide the core processing interface for the automated processing system 100. The programming modules 112 include one or more removable modules that interface with the automated processing system 100. Each of the programming modules 112 may also be configured to accommodate receptacles, which conform to JEDEC standards. These receptacles may contain socket adapters (described in greater detail in FIG. 2), an actuator(s) (described in greater detail in FIG. 2) and a reject bin (described in greater detail in FIG. 2), for receiving devices. After the devices, such as unprogrammed programmable media, are placed within the socket adapters, the actuators close the sockets so that the devices are appropriately connected to the programming modules 112 of the automated processing system 100. Additionally, the programming modules 112 can be controlled by the automated processing system 100 for facilitating configuration setup and manual operations, such as placing and removing programmable media.

Additionally, by way of example, each of the modules within the automated processing system 100 may include a module controller 500 (described in greater detail in FIG. 5), which allows each module to be set-up for purposes of programming, configuration, and identification. The module controller 500 and its function can be integrated as part of the touch screen user interface system displayed by the monitor 104.

Although the automated processing system 100 has been described with reference to the programming modules 112, it is to be understood that the programming modules 112 may include other modules used to support various operations. For example, the programming modules 112 can be replaced by testing modules that measure various electrical parameters of a multitude of devices to verify specification conformance. Furthermore, by way of example, the programming modules 112 could be replaced by mini-assembly modules that permit the fabrication of a device in a single-stage or multi-stage assembly process. Accordingly, the present invention is not to be limited to the above and includes any type of module application that can be processed within the automated processing system 100.

The control electronics 114 are also mounted on the frame 102. The control electronics 114 provide an electrical interface for the automated processing system 100. For example, the control electronics 114 may possess a power ON/OFF switch and/or digital input/output boards. For example, the digital input/output boards may provide an interface for the activation of indicators, pumps, lights, etc., within the automated processing system 100. The digital input/output boards may also provide an interface for sensing the state of various sensors. Additionally, the control electronics 114 provides an interface for peripheral devices, such as a USB device, a keyboard, a mouse, etc.

The status indicator 116 is also mounted on the frame 102. The status indicator 116 provides visual feedback, via a non-text error signal, to the user about machine status. As an exemplary illustration, the status indicator 116 may use a multi-color scheme employing more than one light combination. The particular combination can be done in such a way that a green light indicates the machine is in operation, a yellow light indicates that attention may be needed soon and a red light indicates there may be a problem, and the machine is stopped, or that the job has terminated normally. However, it is to be understood that any color scheme may be used to convey the notions of operation-ready, attention may be needed soon, and operation-termination.

Notably, the automated processing system 100 does not rely on external air, pneumatic or vacuum systems, which greatly enhances the portability of the machine and ease of installation. The automated processing system 100 possesses an on-board vacuum/air system that is powered by electrical current, therefore, the automated processing system 100 is a self-sufficient system that only requires electrical power for operation. Additionally, the back of the automated processing system 100 may possess additional power modules.

Figure 2:
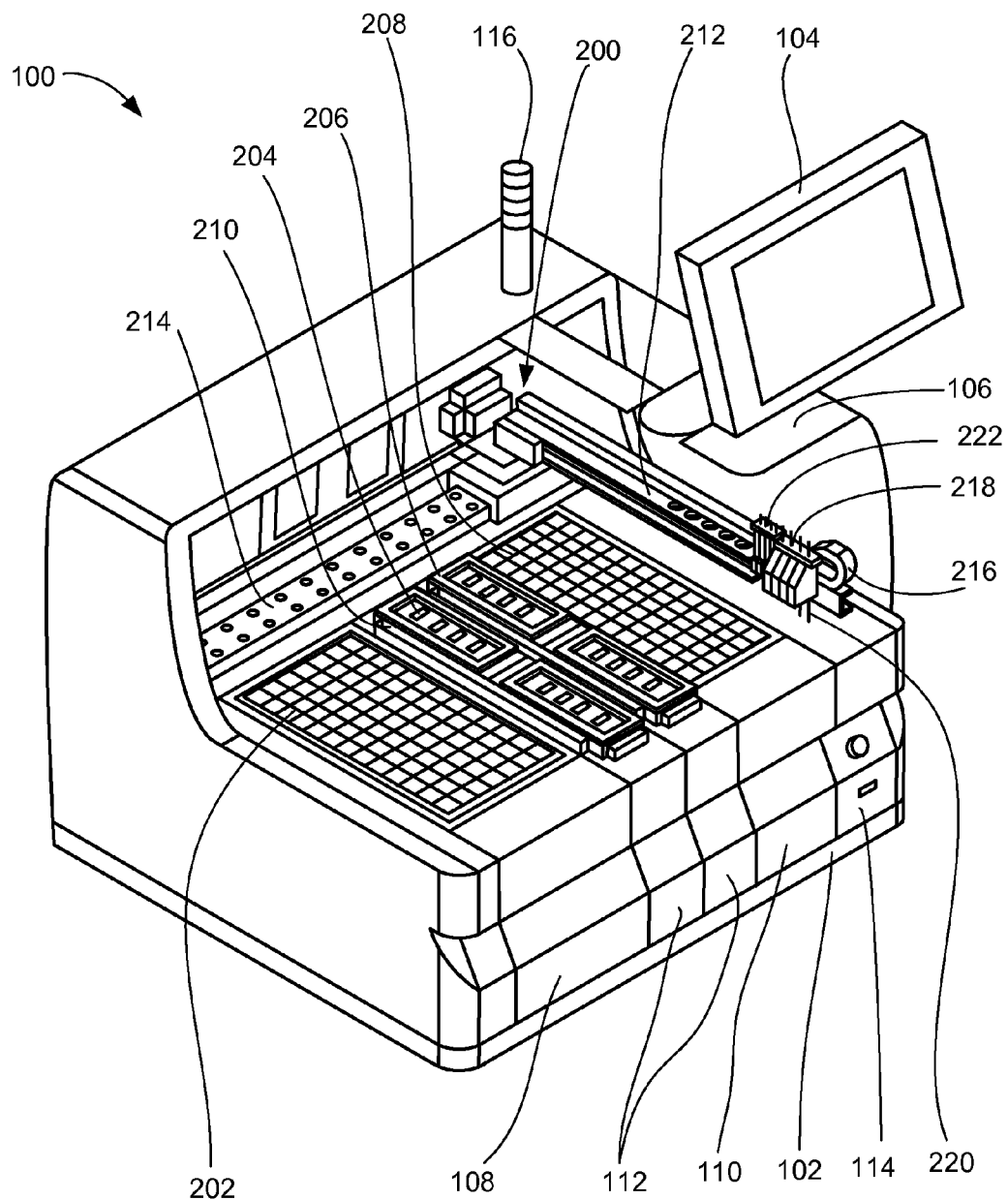
FIG. 2 is an isometric view of an automated processing system with part of a cover removed in accordance with an embodiment of the present invention.

Referring now to FIG. 2, therein is shown an isometric view of the automated processing system 100 with part of the cover 106 removed in accordance with an embodiment of the present invention. The automated processing system 100 includes the frame 102, the monitor 104, the input module 108, the output module 110, the programming modules 112, the control electronics 114, the status indicator 116, a robotics system 200, an input device receptacle 202, socket adapters 204, actuators 206, an output device receptacle 208, a reject bin 210, a gantry 212, a track 214, an arm 216, a head system 218, nozzles 220 and an optics system 222. Furthermore, although not shown, the automated processing system 100 may include additional modules, such as a marking module, a tape in module and/or a tape out module.

During operation, the robotics system 200, which includes a pick-and-place system, retrieves one or more devices (not shown) from the input device receptacle 202, located over the input module 108. The robotics system 200 then transports the device(s) to the programming modules 112, which possess the socket adapters 204 and the actuators 206. Once the devices are engaged by the socket adapters 204, programming may commence. Once programming is complete, the robotics system 200 then transports the good devices to the output device receptacle 208, located over the output module 110, and transports the bad devices to the reject bin 210.

The robotics system 200 is attached to an L-shaped base, which is part of the frame 102. However, it is to be understood that other shaped bases may be used. In accordance with the invention, the base shape should provide a rigid, lightweight, cast, yet "open" platform for the robotics system 200.

As an exemplary illustration, the L-shaped base provides such a platform and allows easy access to the working envelope of the automated processing system 100. The working envelope includes the input device receptacle 202, the socket adapters 204, the actuators 206, and the output device receptacle 208. Additionally, the L-shaped base also facilitates the incorporation of a feeder bank with the automated processing system 100.

Furthermore, the L-shaped base includes a built-in smart interface system, with multiple ports, for the interfacing of modules. The smart interface system provides an easy integration mechanism for the automatic recognition of modules during setup of the automated processing system 100. For example, the smart interface system may recognize module information, such as the identification of the module (i.e.—the type of module, the configuration of the module, and the geometry of the module) and the location of the module within the system or feeder bank. By enabling the automatic recognition of module information, the smart interface system uniquely provides a flexible, modular, "plug-and-play" design.

By incorporating the multiple port smart interface system as part of the L-shaped base, the modules can now be plugged into almost any location within the automated processing system 100. Accordingly, an operator may configure the modules as close as possible to maximize throughput or the operator can plug the modules into certain locations to minimize processing trouble.

The robotics system 200 employs a cantilevered design, thereby utilizing the open access to the working envelope offered by the L-shaped base. The robotics system 200 includes the gantry 212, the track 214, the arm 216, the head system 218, the nozzles 220 and the optics system 222. The gantry 212 supports the arm 216, the head system 218, the nozzles 220, and the optics system 222. The gantry 212 slides back and forth (i.e.—in the X direction) across the track 214. The head system 218, the nozzles 220, and the optics system 222 slide back and forth (i.e.—in the Y direction) across the arm 216 supported by the gantry 212. The head system 218 may additionally move up and down (i.e.—in the Z direction) and rotate (i.e.—in the theta direction).

The head system 218, may include by way of example and not by way of limitation, a pick-and-place head system, which can employ multiple design configurations, such as a multi-probe and nozzle design. The head system 218 is a small sized, lightweight system designed to facilitate fast and accurate movements. Imprecise movements of the head system 218 are accommodated for by a built-in compliance mechanism, such as a mechanical sprint and/or an electromechanical control mechanism for the Z-axis motors. More generally, the built-in compliance mechanism can be based upon mechanical principles, such as a spring, or upon electrical principles.

In further attempts to reduce the size and weight of the head system 218, particular aspects of the invention employ limited theta or rotational movement for each up and down or Z position.

The head system 218 may be powered by an electrical stimulus, a pneumatic stimulus or any stimulus that produces the desired result of moving the head system 218. Uniquely, the nozzles 220 of the head system 218 do not rely on an external air supply. If pneumatics are used to operate the nozzles 220, they are provided via an on-board vacuum system. Therefore, the automated processing system 100 can be designed to only require electrical power for operation. By not requiring each potential operations facility to possess a clean and special external air supply, the automated processing system 100 becomes universally portable and employable.

To minimize the number of moving cables and the weight of the energy cable, the controls of the robotics system 200 have been distributed. For example, controls, such as the gantry 212, the track 214, the head system 218, the optics system 222, and the modules are all distributed to minimize the number of moving cables and the weight of the energy cable. Although all these controls are distributed, they are all still connected to the main control electronics via a bus system, such as a controller area network bus. Additionally all controls are connected to each other but can still operate independently.

Furthermore, to minimize the weight of any moving parts of the robotics system 200, its power systems, its electrical systems and its pneumatic systems are distributed around the automated processing system 100. For example, the robotics system 200 power modules can be located on the base, the robotics system 200 electrical systems can be located on the sides, and the robotics system 200 pneumatic system can be located on the back.

The robotics system 200, and more generally the automated processing system 100, can be controlled by a user interface system, such as a graphical non-text user interface system. In accordance with the scope of the present invention, a non-text user interface system uses only numbers, characters, pictorial representations and international symbols to communicate information to an operator and not written words. This language independent user interface system can provide feedback to an operator via visual or auditory stimulus.

The user interface system, displayed by the monitor 104, provides a "real time" image of the working envelope (i.e.—the system configuration). By mimicking the real time configuration of the working envelope, the monitor 104 helps the operator to visualize the machine operations, shorten the learning time for an operator, and eliminates operator mistakes during set up of the automated processing system 100. Additionally, the real time image on the monitor 104 can increase operator productivity due to its accurate representation of the working envelope.

Not only does the user interface system display a real time image of the working envelope, but it may also provide programming setup and status information. In general, the user interface system of the present invention includes the following categories to control a programming system: job selection, programming, device and hardware detection, and statistical job feedback. These categories are controlled via a plethora of functions, such as job status inquires, job control, job tools, socket use, job selection, receptacle map, and measure receptacle. These functions provide a workable user interface for the automated processing system 100 that do not require textual representation, and therefore allow global application of the user interface.

Additionally, the user interface system can be configured for remote operation, as well as, remote diagnostics access.

Furthermore, the user interface system includes an automatic receptacle-mapping feature, which enables the robotics system 200. The automatic receptacle-mapping feature is enhanced by the smart interface system, which assimilates information about intelligent modules (described further below) interfaced with the automated processing system 100. For example, the smart interface system may sense the physical configuration and position of a module, such as the type of module being used and its location.

Generally, the automatic receptacle-mapping feature will automatically measure the physical characteristics and geometry of a receptacle, such as the number of rows and columns, the row offset and pitch, and the column offset and pitch. These automatic measurements provide information about the exact coordinates (i.e.—X, Y, Z and theta directions or sometimes only X and Y directions) for each center of pocket within each receptacle (i.e.—the location for each device).

The automatic receptacle-mapping feature employs optical methods based upon changes of state, such as reflectivity, and specifically designed algorithms to calculate receptacle location, geometry and physical characteristics. This mapping feature is designed in such a way that the operator no longer has to manually enter in the physical characteristics and geometry of the receptacle, which saves the operator time and prevents operator input error.

Additionally, the automated processing system 100 has been configured to accept modules with intelligent design. These intelligent design modules are configured to interface with the automated processing system 100, wherein the automated processing system 100 can immediately recognize module information, such as the identification of the module (i.e.—the type of module, the configuration of the module, and the geometry of the module) and the location of the module within the system or feeder bank. These intelligent design modules will be described in greater detail in FIG. 3.

Figure 3:
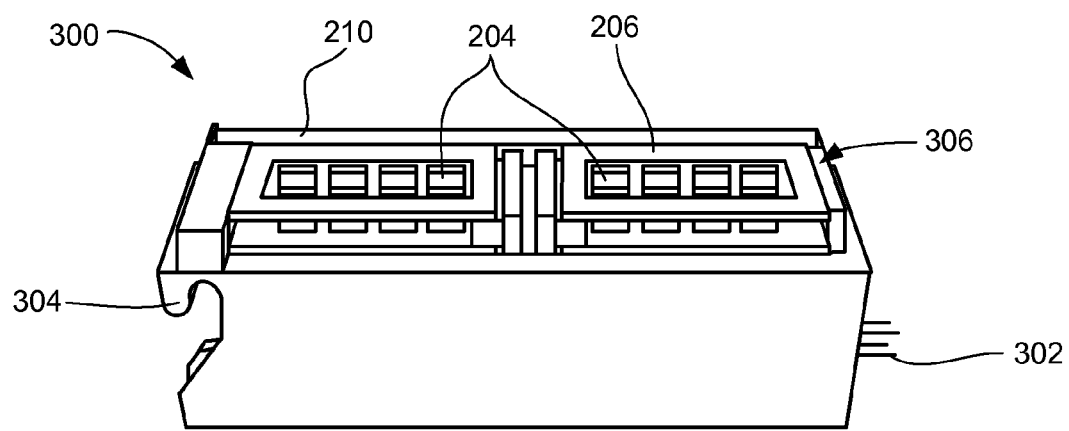
FIG. 3 is an isometric view of an intelligent module in accordance with an embodiment of the present invention.

Referring now to FIG. 3, therein is shown an isometric view of an intelligent module 300 in accordance with an embodiment of the present invention. Although, FIG. 3 depicts the intelligent module 300 as an intelligent programming module, the intelligent module 300 may include modules, such as an intelligent input module, an intelligent output module, an intelligent testing module, and/or an intelligent mini-assembly module. However, the intelligent module 300 is not to be limited to the above representations and examples, and the intelligent module 300 may include any module, which can be interfaced with the automated processing system 100, of FIGS. 1 and 2.

Generally, the present invention includes modules of intelligent design with a composite connection 302, handle 304 (for easy transport), hot swapping capacity, limited power circuitry, and "sit-flat" capability. The composite connection 302 permits a "plug-and-play" modular design, wherein the automated processing system 100 automatically recognizes the module when it is connected to the smart interface system. The composite connection 302 may include a data transmission line 506, of FIG. 5, a control transmission line 504, of FIG. 5, and a power transmission line 508, of FIG. 5.

As exemplary illustrations, the data transmission line 506 can be a bidirectional transmission line used to broadcast device image data, send commands, and receive status information for programming operations. Due to the volume of data transmitted by the data transmission line 506, a high-speed port, such as an Ethernet connection is usually employed as the data port. Any module that would require the transmission of large amounts of data could use the data transmission line 506. The control transmission line 504 can be a bi-directional transmission line, such as a controller area network (CAN) bus, used to transmit commands to and status from the modules. The power transmission line 508 transmits power to each module. The power supplied to each module via the power transmission line 508 can be electrical, but in principle, it could be mechanical, pneumatic, hydraulic, magnetic, optical, and/or chemical.

More specifically, by way of example, the composite connection 302 may transmit information about whether the operator has installed a module, such as the input module 108, of FIG. 1, the output module 110, of FIG. 1, or the programming module(s) 112, of FIG. 1. Furthermore, by way of example, the composite connection 302 may permit transference of information, such as the identification of the module (i.e.—the type of module, the configuration of the module, and the geometry of the module), the location of the module within the system, and also status/error conditions about the module, as well. Additionally, by way of example, the composite connection 302 may also transmit command information and status information to and from the module, such as the status of the actuators 206 whether or not the actuators 206 are opened or closed, whether or not the reject bin 210 has been installed, whether or not a receptacle has been installed, and determination of the type of programming receptacle installed.

Notably, intelligently designed modules are capable of being hot swapped. Hot swapped, hot swappable and/or hot swapping means that a module can be unplugged from the automated processing system 100 while it is running, and another one plugged in, without having to shut down the automated processing system 100. By maintaining the module configuration information and the ability to communicate such information within each intelligently designed module, the timely and costly process of reconfiguring the automated processing system 100 is avoided.

Additionally, the intelligently designed modules can be designed not to require internal power, which minimizes their weight and costs; however, they can designed with internal power circuitry, if needed. Furthermore, each module is designed to "sit-flat" for easy storage.

More specifically, the intelligent module 300 (i.e.—depicted as an intelligent programming module) includes the above features but also includes the following features: an auto-adjusting force limit system, programming sites 306, and socket adapters 204. For example, the intelligent module 300 may include an auto-adjusting force limit system, which allows the actuators 206 to generate a large force value, but only apply the force that is necessary to open the socket adapters 204. The auto-adjusting force limit system helps to prevent damage to the socket adapters 204, and consequently, prolongs their life.

The intelligent module 300 is also depicted as possessing two of the programming sites 306 per module; however, the intelligent module 300 may include one or more of the programming sites 306 per module as required by the design parameters of the automated processing system 100. The programming sites 306 are bounded by the actuators 206. Additionally, the intelligent module 300 depicts four of the socket adapters 204 per each of the programming sites 306; however, the programming sites 306 may include one or more of the socket adapters 204 as required by the design parameters of the automated processing system 100. Additionally, the reject bin 210 can be mounted on a side of the intelligent module 300, to provide clear visual feedback to the operator about, which of the programming sites 306 is committing the biggest failure percentage. This qualitative measure informs the operator about potential failure of one of the programming sites 306 or one of the socket adapters 204.

Figure 5:
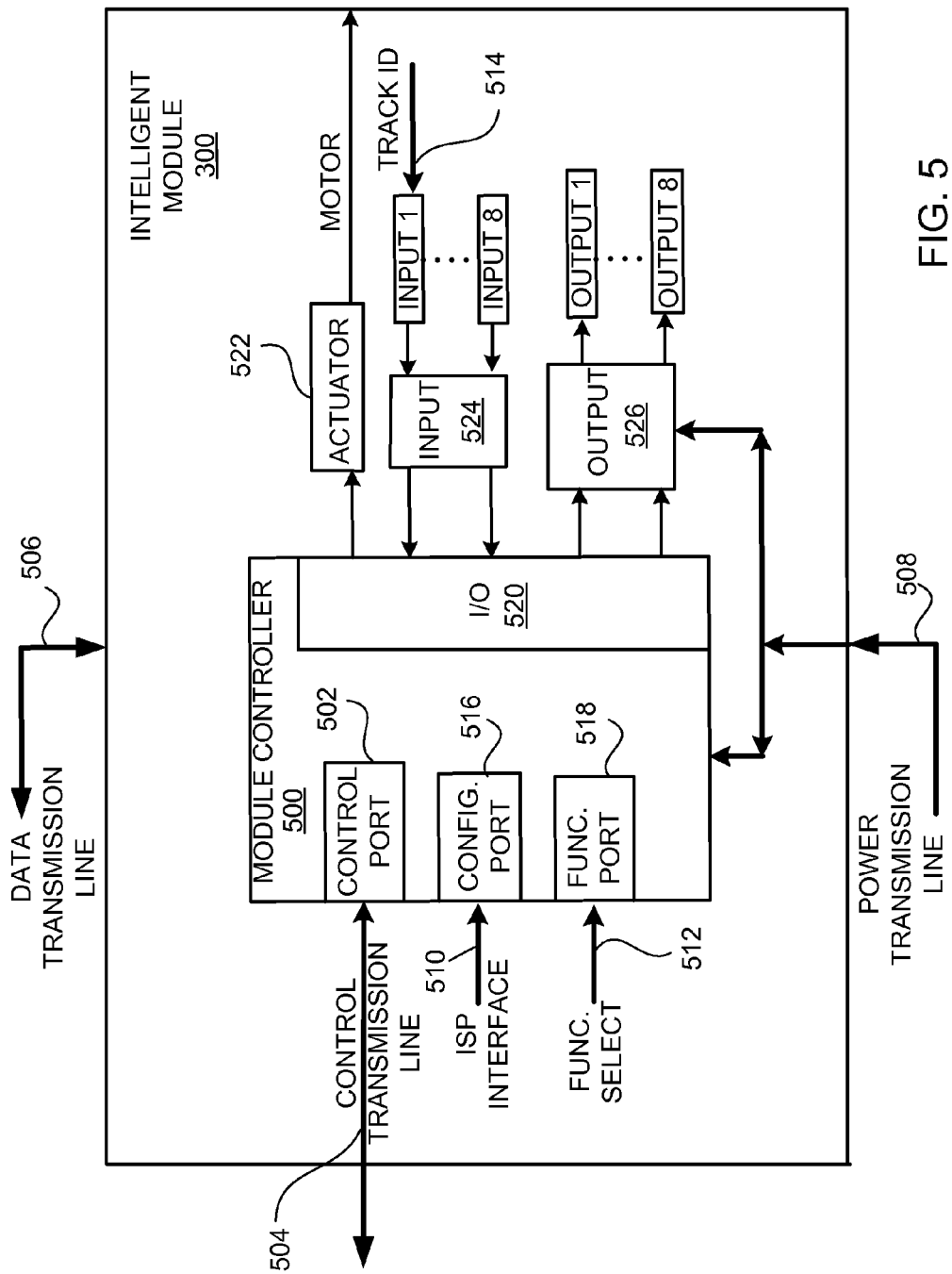
FIG. 5 is a functional block diagram of an intelligent module in accordance with an embodiment of the present invention.

The intelligent module 300 may also include the module controller 500, of FIG. 5, which allows each module to be set-up for purposes of programming, configuration, and identification. The module controller 500 and its function can be integrated as part of the touch screen user interface system displayed by the monitor 104.

Figure 4:
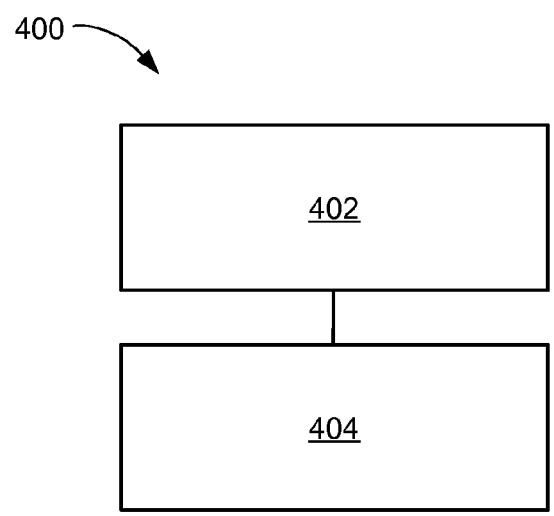
FIG. 4 is a flow chart for an automated processing system for fabricating the automated processing system in accordance with an embodiment of the present invention.

Referring now to FIG. 4, therein is shown a flow chart for an automated processing system 400 for fabricating the automated processing system 100 in accordance with an embodiment of the present invention. The automated processing system 400 includes providing an intelligent module with a composite connection for transmitting information in a block 402; and configuring the intelligent module within the automated processing system for automatic recognition in a block 404.

Referring now to FIG. 5, therein is shown a block diagram of the intelligent module 300 in accordance with an embodiment of the present invention. The intelligent module 300 includes a module controller 500 with a control port 502, a control transmission line 504, a data transmission line 506, a power transmission line 508, an interrupt service provider (ISP) interface 510, a function select 512, a track identification (ID) 514, a configuration port 516, a function port 518, an input/output interface 520, an actuator motor and logic driver 522, an input conditioner 524, and an output conditioner 526. The operation of the module controller 500 can be controlled by common protocol proprietary DATA I/O software, which may employ a broadcasting (multi-master) method, along with a prioritized messaging system.

It is to be understood that the following examples of the various ports, inputs and outputs of the intelligent module 300 are provided merely for purposes of illustration and are not to be construed as limiting.

Generally, the module controller 500 of the intelligent module 300 is responsible for transmitting commands between the automated processing system 100 and the intelligent module 300. For example, the module controller 500 can be responsible for interpreting commands given to the intelligent module 300 by the robotics system 200, of FIG. 2. After processing the commands given to the intelligent module 300, the module controller 500 decides whether these commands were meant for the intelligent module 300, and what action should be taken.

The control port 502, such as a CAN port, of the module controller 500 receives and transmits commands over the control transmission line 504, such as a bi-directional CAN bus. As exemplary illustrations, commands may include, but are not limited to, the type of module present in the system, the location of the module within the system, whether or not if a socket of the programming module 112, of FIGS. 1 and 2, is open, and whether or not if a tray or receptacle is present.

The intelligent module 300 also includes the data transmission line 506 and the power transmission line 508. The data transmission line 506 is a passive bi-directional transmission line for sending and receiving data to and from the intelligent module 300. The power transmission line 508 is used to distribute power to the various components of the intelligent module 300. The control transmission line 504, the data transmission line 506, and the power transmission line 508 may generally be referred to as external transmission lines.

The intelligent module 300 may also contain internal transmission lines, used only within the module. For purposes of illustration, the internal transmission lines may include the ISP interface 510, the function select 512, and the track ID 514. The configuration port 516 receives information from the ISP interface 510. By way of example, the ISP interface 510 allows firmware within the module controller 500 to be changed and/or initial programming of the module controller 500. The function port 518 receives information from the function select 512. By way of example, the function select 512 is used to determine how the module controller 500 will act (e.g.—as a tray module or a programmer module).

The input/output interface 520 receives information from the track ID 514. By way of example, the track ID 514 is used to determine at which track location a module is plugged into within the automated processing system 100, of FIGS. 1 and 2. Accordingly, the track ID 514 helps to differentiate between modules because only a module at the correct track location specified in a command will respond.

The input/output interface 520 may also provide signals to the actuator motor and logic driver 522. For example, the actuator motor and logic driver 522 may drive the actuators 206, of FIG. 2, via a direct current. Furthermore, the input/output interface 520 may provide and receive various assorted signals to and from a variety of sensors and/or actuators through an input conditioner 524 or an output conditioner 526.

Uniquely, the module controller 500 can be designed to be identical for each of the intelligent module 300 placed within the automated processing system 100. Accordingly, the function of each module can then be determined/programmed via the function select 512. For example, a module with a tray identification will react differently than a module with a programmer identification, even though the tray module and the programmer module are identical, the only difference being a different dip switch setting.

As is evident from the disclosure herein, the intelligent module 300 functions as shown in the block diagram and its operation would be evident to one having ordinary skill in the art.

From the above it will be understood that the present invention is applicable to what can be described as "devices" or "media". Devices and/or media include a broad range of electronic and mechanical devices. The best mode describes programming of devices and/or media, which include, but are not limited to, Flash memories (Flash), electrically erasable programmable read only memories (EEPROM), programmable logic devices (PLDs), field programmable gate arrays (FPGAs), and microcontrollers. However, the present invention encompasses programming for all electronic, mechanical, hybrid, and other devices or media, which require testing, measurement of device characteristics, calibration, and other programming operations. For example, these types of devices and/or media would include, but not be limited to, microprocessors, integrated circuits (ICs), application specific integrated circuits (ASICs), micro mechanical machines, micro-electro-mechanical (MEMs) devices, micro modules, and fluidic systems.

It has been discovered that the present invention thus has numerous aspects. A principle aspect of the present invention is the intelligent module, which allows the automated processing system to automatically recognize the intelligent module. For example, the "plug-and-play" capability of each module allows transference of information, such as the identification of the module (i.e.—the type of module, the configuration of the module, and the geometry of the module) and the location of the module within the system.

Another aspect of the present invention is the ability to hot swap intelligent modules. Hot swapping allows an operator to remove an intelligent module from the automated processing system, and install another intelligent module, without having to restart the system. This feature allows for the seamless integration of a mechanism for removing or adding an intelligent module.

Yet still, another aspect of the present invention is that the automated processing system does not require an external air supply. The automated processing system is designed to only require electrical power, thereby greatly enhancing the portability of the automated processing system.

These and other valuable aspects of the present invention consequently further the state of the technology to at least the next level.

Thus, it has been discovered that the automated processing system of the present invention furnishes important and heretofore unknown and unavailable solutions, capabilities, and functional aspects. For instance, the automated processing system of the present invention employs intelligent modules, hot swapping capability, and an on-board air supply to facilitate user operation of the automated processing system. The resulting processes and configurations are straightforward, cost-effective, uncomplicated, highly versatile and effective, can be implemented by adapting known technologies, and are thus readily suited for efficient and economical manufacturing.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations, which fall within the scope of the included claims. All matters hithertofore set forth herein or shown in the accompanying drawings are to be interpreted in an illustrative and non-limiting sense.

The invention claimed is:

1. A method of fabrication of an automated processing system comprising:
   providing an intelligent module with a composite connection for transmitting information;
   configuring the intelligent module within the automated processing system for automatic recognition; and
   providing a robotics system including a head system with a multi-probe and nozzle design with a built-in compliance mechanism for transporting a device within the automated processing system.

2. The method as claimed in claim 1 further comprising:
   enabling the intelligent module for hot swapping.

3. The method as claimed in claim 1 further comprising:
   providing the automated processing system with a smart interface.

4. The method as claimed in claim 1 further comprising:
   configuring the automated processing system to recognize type, location, configuration, status, commands, and geometry information about the intelligent module.

5. The method as claimed in claim 1 further comprising:
   configuring the automated processing system to include a desktop handler system.

6. A method of fabrication of an automated processing system comprising:
   providing an intelligent module capable of being hot swapped;
   configuring the intelligent module with a composite connection for automatic recognition during hot swapping; and
   providing a robotics system including a head system with a multi-probe and nozzle design with a built-in compliance mechanism for transporting a device within the automated processing system.

7. The method as claimed in claim 6 wherein:
   providing the intelligent module includes providing an input module, an output module and a programming module.

8. The method as claimed in claim 6 wherein:
   providing the intelligent module includes providing a programming module with an auto-adjusting force limit system.

9. The method as claimed in claim 6 further comprising:
   configuring the intelligent module to either maximize throughput or minimize processing trouble.

10. The method as claimed in claim 6 further comprising:
    configuring the automated processing system to rely on electrical power.

11. An automated processing system comprising:
    an intelligent module with a composite connection for transmitting information;
    the intelligent module configured within the automated processing system for automatic recognition; and
    a robotics system including a head system with a multi-probe and nozzle design with a built-in compliance mechanism for transporting a device within the automated processing system.

12. The system as claimed in claim 11 wherein:
    the intelligent module is enabled for hot swapping.

13. The system as claimed in claim 11 wherein:
    the automated processing system includes a smart interface.

14. The system as claimed in claim 11 wherein:
    the automated processing system includes a desktop handler system.

15. The system as claimed in claim 11 wherein:
    the automated processing system is configured to recognize type, location, configuration, status, commands, and geometry information about the intelligent module.

16. The system as claimed in claim 11 wherein:
    the intelligent module includes a programming module with an auto-adjusting force limit system.

17. The system as claimed in claim 11 wherein:
    the intelligent module placement is configured to either maximize throughput or minimize processing trouble.

18. The system as claimed in claim 11 wherein:
    the automated processing system relies on electrical power.

19. The system as claimed in claim 11 wherein:
    the automated processing system includes a frame with an L-shape.

20. The system as claimed in claim 19 wherein:
    the frame includes the robotics system with a cantilever design.

* * * * *